(12) United States Patent
Huang et al.

(10) Patent No.: US 11,075,314 B2
(45) Date of Patent: *Jul. 27, 2021

(54) DOPED ABSORPTION PHOTODIODE

(71) Applicant: Hewlett Packard Enterprise Development LP, Houston, TX (US)

(72) Inventors: Zhihong Huang, Palo Alto, CA (US); Raymond G. Beausoleil, Seattle, WA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/890,374

(22) Filed: Jun. 2, 2020

(65) Prior Publication Data

US 2020/0303582 A1 Sep. 24, 2020

Related U.S. Application Data

(62) Division of application No. 15/747,760, filed as application No. PCT/US2015/042250 on Jul. 27, 2015, now Pat. No. 10,680,131.

(51) Int. Cl.
*G02B 6/12* (2006.01)
*H01L 31/107* (2006.01)
(Continued)

(52) U.S. Cl.
CPC .............. *H01L 31/109* (2013.01); *G02B 6/12* (2013.01); *G02B 6/12004* (2013.01);
(Continued)

(58) Field of Classification Search
CPC .. G02B 6/10; G02B 6/12; G02B 2006/12061; H01L 31/0232; H01L 31/02327;
(Continued)

(56) References Cited

U.S. PATENT DOCUMENTS 7,233,051 B2 6/2007 Morse et al.
7,397,101 B1 * 7/2008 Masini .................. H01L 31/028
257/184

(Continued)

FOREIGN PATENT DOCUMENTS

CN 201885758 U 6/2011

OTHER PUBLICATIONS

Carroll, M. et al., "Germanium-Silicon Separate Absorption and Multiplication Avalanche Photodectectors Fabricated with Low Temperature High Density Plasma Chemical Vapor Deposited Germanium," (Research Paper), Jul. 30, 2007, vol. 989, pp. 0989-A12.

(Continued)

*Primary Examiner* — Maliheh Malek
(74) *Attorney, Agent, or Firm* — Hewlett Packard Enterprise Patent Department

(57) ABSTRACT

An example device includes a doped absorption region to receive optical energy and generate free electrons from the received optical energy. The example device also includes a doped charge region to increase an electric field. The example device also includes an intrinsic multiplication region to generate additional free electrons from impact ionization of the generated free electrons. The example device includes a doped contact region to conduct the free electrons and the additional free electrons.

15 Claims, 8 Drawing Sheets

(51) Int. Cl.
H01L 31/18 (2006.01)
H01L 31/109 (2006.01)
H01L 31/0232 (2014.01)
H01L 31/028 (2006.01)
H01L 31/105 (2006.01)

(52) U.S. Cl.
CPC ...... H01L 31/028 (2013.01); H01L 31/02327 (2013.01); H01L 31/105 (2013.01); H01L 31/1075 (2013.01); H01L 31/1804 (2013.01); G02B 2006/12061 (2013.01); G02B 2006/12123 (2013.01)

(58) Field of Classification Search
CPC ............. H01L 31/0248; H01L 31/0256; H01L 31/0264; H01L 31/0284; H01L 31/0288; H01L 31/14; H01L 31/16; H01L 31/18
See application file for complete search history.

(56) References Cited

U.S. PATENT DOCUMENTS

| | | | |
|---|---|---|---|
| 7,741,657 B2* | 6/2010 | Pauchard | H01L 31/035281 257/186 |
| 8,410,420 B1 | 4/2013 | Hochberg et al. | |
| 8,538,206 B1* | 9/2013 | Fish | G02F 1/025 385/2 |
| 8,538,221 B1* | 9/2013 | Fang | H01S 5/2018 385/129 |
| 8,861,909 B2* | 10/2014 | Lipson | H01L 31/02327 385/40 |
| 9,219,184 B2* | 12/2015 | Huang | H01L 31/022416 |
| 9,391,225 B1* | 7/2016 | Davids | G02B 6/02 |
| 9,490,385 B2* | 11/2016 | Huang | H01L 31/1075 |
| 9,612,503 B2* | 4/2017 | Liang | G02F 1/2257 |
| 9,614,119 B2* | 4/2017 | Kang | H01L 33/0012 |
| 9,748,429 B1* | 8/2017 | Davids | G02B 6/12004 |
| 9,755,096 B2* | 9/2017 | Novack | H01L 31/1075 |
| 10,277,008 B1* | 4/2019 | An | H01S 5/34 |
| 10,797,194 B2* | 10/2020 | Zeng | H01L 31/1804 |
| 2002/0066938 A1* | 6/2002 | Pauchard | H01L 31/02327 257/461 |
| 2003/0165314 A1* | 9/2003 | Nagarajan | H01S 5/0268 385/131 |
| 2005/0051861 A1* | 3/2005 | Shi | H01L 31/107 257/438 |
| 2006/0062537 A1* | 3/2006 | Ranganath | G02B 6/12004 385/131 |
| 2006/0251375 A1* | 11/2006 | Morse | H01L 31/1075 385/141 |
| 2006/0289957 A1* | 12/2006 | Morse | H01L 31/1812 257/438 |
| 2007/0031080 A1* | 2/2007 | Liu | G02F 1/025 385/3 |
| 2007/0152289 A1* | 7/2007 | Morse | H01L 31/028 257/431 |
| 2008/0017883 A1* | 1/2008 | Sarid | H01L 31/1075 257/186 |
| 2008/0037607 A1* | 2/2008 | Hashimoto | B82Y 20/00 372/45.01 |
| 2009/0257703 A1* | 10/2009 | Bratkovski | H01L 31/105 385/2 |
| 2010/0059822 A1* | 3/2010 | Pinguet | H04B 10/2575 257/351 |
| 2011/0012221 A1* | 1/2011 | Fujikata | G02B 6/12004 257/458 |
| 2011/0091146 A1* | 4/2011 | Knights | G02F 1/025 385/2 |
| 2012/0177318 A1* | 7/2012 | Zheng | G02F 1/025 385/1 |
| 2012/0326259 A1* | 12/2012 | Huang | H01L 31/1075 257/438 |
| 2013/0292741 A1* | 11/2013 | Huang | H01L 31/1075 257/186 |
| 2013/0313579 A1* | 11/2013 | Kouvetakis | H01L 31/105 257/80 |
| 2014/0048772 A1* | 2/2014 | Kim | H01L 33/0054 257/21 |
| 2014/0127842 A1* | 5/2014 | Song | H01P 11/001 438/31 |
| 2014/0151839 A1* | 6/2014 | Kang | H01L 33/0012 257/438 |
| 2014/0177994 A1* | 6/2014 | Chen | H01L 33/58 385/2 |
| 2014/0291682 A1* | 10/2014 | Huang | H01L 31/1075 257/55 |
| 2015/0001581 A1* | 1/2015 | Oda | H01L 31/1075 257/186 |
| 2015/0028443 A1 | 1/2015 | Shi et al. | |
| 2015/0076641 A1* | 3/2015 | Huang | H01L 31/02325 257/432 |
| 2015/0097256 A1* | 4/2015 | Ang | G02B 6/00 257/432 |
| 2015/0108327 A1* | 4/2015 | Huang | H01L 31/035281 250/200 |
| 2016/0043262 A1* | 2/2016 | Okumura | H01L 31/028 257/184 |
| 2016/0126381 A1* | 5/2016 | Wang | H01L 31/024 257/429 |
| 2016/0204298 A1* | 7/2016 | Chen | H01L 31/02327 257/432 |
| 2016/0276807 A1* | 9/2016 | Cai | H01S 5/026 |
| 2016/0307939 A1* | 10/2016 | Wang | H04B 10/6971 |
| 2016/0351743 A1* | 12/2016 | Yu | G02B 6/12004 |
| 2017/0256671 A1* | 9/2017 | Kang | H01L 31/1075 |
| 2017/0271543 A1* | 9/2017 | Huang | H01L 31/1075 |
| 2017/0331249 A1* | 11/2017 | Liang | H01S 5/0265 |
| 2018/0097139 A1* | 4/2018 | Li | H01L 31/107 |
| 2018/0180805 A1* | 6/2018 | Huang | G02B 6/122 |
| 2019/0019899 A1* | 1/2019 | Wang | H01L 31/02327 |
| 2019/0019902 A1* | 1/2019 | Ye | H01L 31/028 |
| 2019/0019903 A1* | 1/2019 | Ye | H01L 31/105 |
| 2019/0157472 A1* | 5/2019 | Nada | H01L 31/02327 |
| 2019/0165200 A1* | 5/2019 | Masini | H01L 31/107 |
| 2019/0229227 A1* | 7/2019 | Samani | H01L 31/107 |
| 2019/0271808 A1* | 9/2019 | Yoneda | H01L 31/03046 |
| 2020/0185561 A1* | 6/2020 | Huang | H01L 31/0312 |
| 2020/0203548 A1* | 6/2020 | Zeng | G01J 1/44 |
| 2020/0274019 A1* | 8/2020 | Zeng | H01L 25/162 |

OTHER PUBLICATIONS

Dal D et al., "Resonant Normal-Incidence Separate-Absorption-Charge -Multiplication Ge/Si Avalanche Photodiodes," (Research Paper), Sep. 1, 2009, Optics Express 17-19 pp. 16549-16557.

Duan. N. et al., "310 GHz Gain-Bandwidth Product Ge/Si Avalanche Photodetector for 1550mm Light Detection," (Research Paper), Apr. 27, 2012, Optics Express 20.10, pp. 11031-11036.

International Search Report & Written Opinion received in PCT Appliction No. PCT/US015/042250, dated Apr. 27, 2016, 13 pages.

Othman, M.A. et al.,"Reviews on Avalanche Photodicde for Optical Communication Technology," (Research Paper), Jan. 2014, APRN Journal of Engineering and Applied Sciences 9 pp. 35-44, http://www.arpnjournals.com/jeas/research_paper/rp_2014/jeans_0114_997pdf.

Zaoui, W.S. et al., "Frequency Response and Bandwidth Enhancement in Ge/si Avalanche Photodiodes with Over 840ghz Gain-Bandwidth-Product." (Research Paper), Jul. 10, 2009 Optics Express 17.15 pp. 12641-12649, http://www.unistuttgart.de/int/institul/MA_Publicketioner/Sfar_Zaou/2009_OpticsExpress.pdf.

* cited by examiner

DOPED ABSORPTION PHOTODIODE

STATEMENT OF GOVERNMENT RIGHTS

This invention was made with Government support under Contract No. H98230-12-C-0236 awarded by the Maryland Procurement Office. The Government has certain rights in this invention.

CROSS-REFERENCE TO RELATED APPLICATIONS

This application claims priority to U.S. patent application Ser. No. 15/747,760, which was filed on Jan. 5, 2018 and is now U.S. patent Ser. No. 10/680,131, which is based on Application No. PCT/US2015/042250 filed on Jul. 27, 2015, which is herein included by reference in its entirety for all purposes.

BACKGROUND

Photonics are increasingly used to communicate information. For example, photonics may be used for telecommunication over long distances or may be used to communicate within circuits, computers, server farms, and the like. Photodiodes may be used in photonic systems to detect optical signals. The photodiodes may convert a received optical signal into an electrical signal that can be further processed to extract the communicated information.

DETAILED DESCRIPTION

Figure 1:
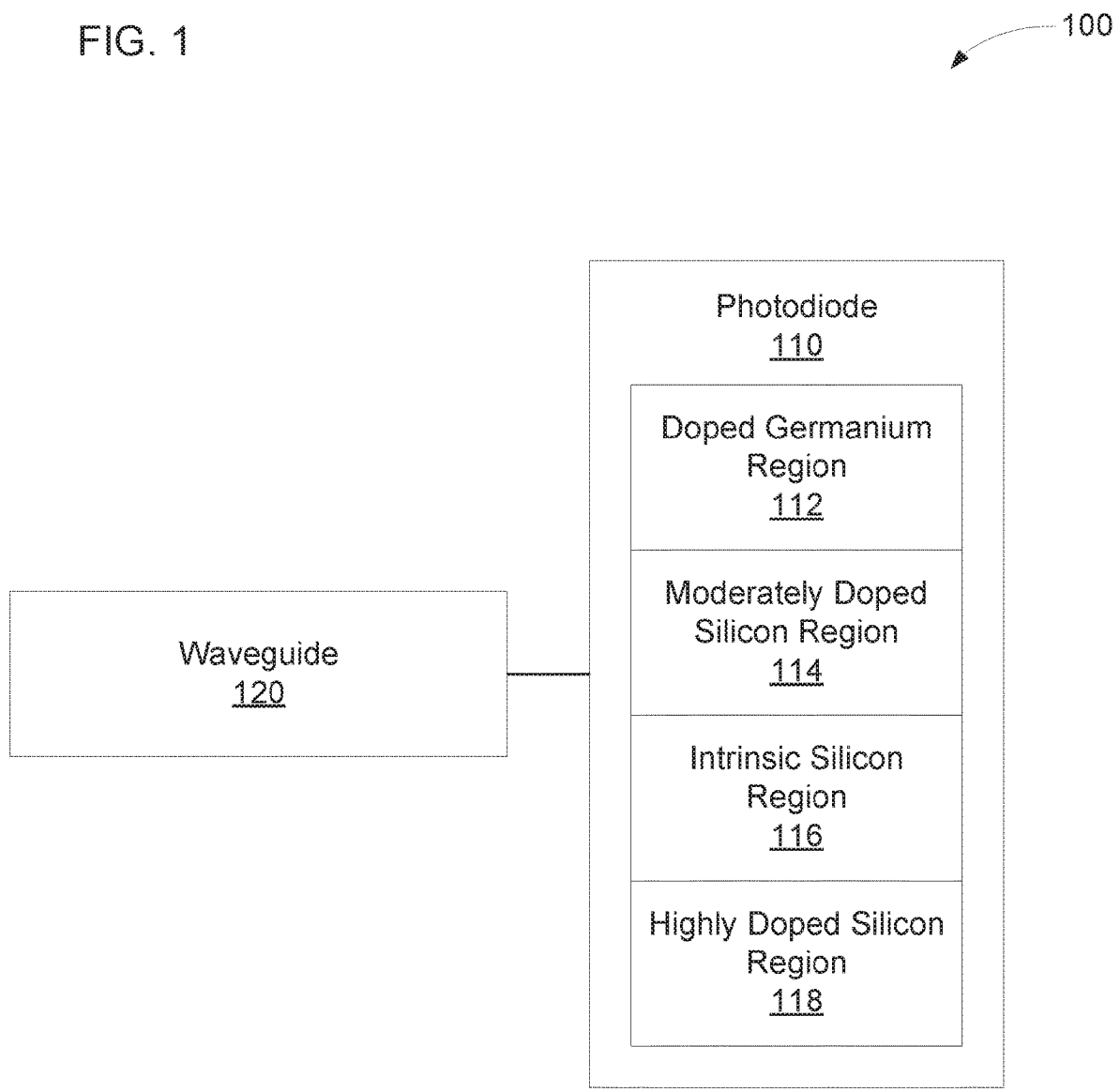
FIG. 1 is a block diagram of an example of a system to detect optical energy.

A photodiode may convert optical signals into electrical signals by absorbing optical energy (e.g., photons) and moving electrons to a conduction band in response to absorbing the optical energy. The electrons in the conduction band are free electrons able to travel through the photodiode in response to an electric field. The photodiode may internally amplify the electrical signal by accelerating the electrons until they free additional electrons through impact ionization. The amplified electrical signal may be output by the photodiode.

The photodiode may include different materials to perform the different functions of the photodiode. For example, germanium is good at absorbing optical energy at the wavelengths typically used for optical communication. However, germanium has an impact ionization ratio (i.e., a k value) near 1, so similar amounts of electrons and holes are generated by impact ionization. As holes are usually slower than electrons, the high impact ionization ratio will reduce a photodiode's speed and gain-bandwidth product. In contrast, silicon has an impact ionization ratio of approximately 0.02, so many more electrons than holes are generated by impact ionization. Accordingly, a silicon photodiode will have a high speed and high gain-bandwidth product. However, silicon is poor at absorbing optical energy at the wavelengths typically used for optical communication.

In one example, a photodiode may include an absorption region made of germanium to absorb optical energy and generate free electrons from the absorbed optical energy. The photodiode may include a charge region made of silicon. The charge region may include an increasing electric field as the distance from the absorption region increases. The photodiode may also include a multiplication region made of silicon to generate additional free electrons from impact ionization. The increasing electric field in the charge region may allow there to be a large electric field in the multiplication region and small electric field in the absorption region. The absorption region may include germanium to take advantage of the absorption characteristics of germanium, and the multiplication region may include silicon to take advantage of the impact ionization characteristics of silicon. Other examples may include materials other than germanium and silicon in the absorption, charge, and multiplication regions, and the materials for each region may be selected based on which material characteristics are most advantageous for each region.

The absorption region of the photodiode may be made of intrinsic germanium. The intrinsic germanium may include a constant electric field that moves the free electrons to the charge region. However, the magnitude of the electric field in the germanium may be very sensitive to the thickness and doping concentration of the charge region. If the charge region is too thin or is underdoped, there will be a strong electric field throughout the absorption region. The strong electric field will cause a significant amount of impact ionization in the germanium. The ratio of hole impact ionization rate to electron impact ionization rate is much higher in germanium than silicon, so more holes will be generated when the impact ionization occurs in the germanium. Because holes travel slower than electrons, the strong electric field will result in the bandwidth of the device being smaller than if the impact ionization occurred in silicon. If the charge region is too thick or is overdoped, there will be a weak electric field in the absorption region. Free electrons will travel to the charge region slowly, so the bandwidth will be smaller than if the charge region had an ideal doping concentration and an ideal thickness.

Similarly, as a bias applied to the photodiode is increased, it will cause the amount of impact ionization occurring in the germanium to increase. As a result, the bandwidth of the photodiode decreases significantly at higher biases. For example, the gain and bandwidth may track a constant gain-bandwidth product until the increasing impact ionization in the germanium causes the gain-bandwidth product to drop significantly for gains above a particular threshold. Above the particular threshold, the electric field in the germanium may be large enough to cause a significant amount of impact ionization in the germanium. Accordingly, there is a need for a photodiode that can maintain a large bandwidth at higher gains and that can deliver a large bandwidth and high gain over a wide range of charge layer doping concentrations and thicknesses.

FIG. 1 is a block diagram of an example of a system 100 to detect optical energy. The system 100 may include a photodiode 110 to convert an optical signal into electrical signal and amplify the electrical signal. The system 100 may also include a waveguide 120 electromagnetically coupled to the photodiode 110. The waveguide 120 may receive an optical signal and transfer it to the photodiode 110 so that the photodiode 110 can convert the optical signal into an electrical signal. The photodiode 110 may include a doped germanium region 112. As used herein, the term "region" refers to a portion of the photodiode 110 or other device occupied by a particular material. For example, the doped germanium region 112 may be an at least moderately doped germanium region (e.g., a moderately or highly doped germanium region.) As used herein, the term "moderately doped" refers to a semiconductor having a concentration of doped atoms between about $5 \times 10^{16}$ atoms/cm$^3$ and about $5 \times 10^{18}$ atoms/cm$^3$. As used herein, the term "highly doped" refers to a semiconductor having a concentration of doped atoms of at least about $1 \times 10^{18}$ atoms per centimeter$^3$ (atoms/cm$^3$). As used herein, the term "about" a particular value refers to numbers that are equal to the particular value when rounded to the least significant digit of the particular value.

The photodiode 110 may include a moderately doped silicon region 114 in direct contact with the doped germanium region 112. The photodiode 110 may include an intrinsic silicon region 116 in direct contact with the moderately doped silicon region 114. As used herein, the term "intrinsic" refers to a semiconductor having a concentration of doped atoms of at most about $5 \times 10^{16}$ atoms/cm$^3$. The photodiode 110 may include a highly doped silicon region 118 in direct contact with the intrinsic silicon region 116.

An electric field in the doped germanium region 112 may increase slowly as the distance to the moderately doped silicon region 114 decreases (e.g., an electric field resulting when a reverse bias is applied to the photodiode 110). The electric field may increase rapidly in the moderately doped silicon region 114 as the distance to the intrinsic silicon region 116 decreases. The electric field may be approximately constant in the intrinsic silicon region 116. The electric field may decrease rapidly in the highly doped silicon region 118 as the distance from the intrinsic silicon region 116 increases.

The sloped electric field in the doped germanium region 112 may prevent the entirety of the doped germanium region 112 from experiencing a strong electric field that causes significant impact ionization even if a portion of the doped germanium region 112 is experiencing such an electric field. As a result, the photodiode 110 may be able to operate at higher gains and with greater variation in the doping concentration and thickness of the moderately doped silicon layer 114 without suffering too much impact ionization in the germanium and a corresponding decrease in speed and gain-bandwidth product. In addition, the doped germanium region 112 may have a short lifetime for free holes, so electrons may be the uni-traveling carrier through the photodiode 110. Because electrons travel more quickly than holes, having electrons as the uni-traveling carriers also improves the speed and gain-bandwidth product of the photodiode 110. In addition, the electron impact ionization coefficient in silicon is much higher than the hole impact ionization coefficient, so having electrons as the uni-traveling carriers makes impact ionization more efficient in the intrinsic silicon region 116. The doping concentration of the doped germanium region 112 may be selected to be low enough to allow for the complete depletion of the doped germanium region 112 while being high enough to limit the amount of impact ionization occurring in the doped germanium region 112 when a portion is experiencing a strong electric field.

The moderately doped silicon region 114 may be at least moderately doped to prevent a strong electric field from extending into the doped germanium region 112. The slope of the electric field may be proportional to the doping concentration, so the intrinsic silicon region 116 can have a strong electric field while the doped germanium region 112 has a weak electric field by at least moderately doping the moderately doped silicon region 114. Accordingly, impact ionization can be maximized in the intrinsic silicon region 116 and minimized in the doped germanium region 112.

Figure 2:
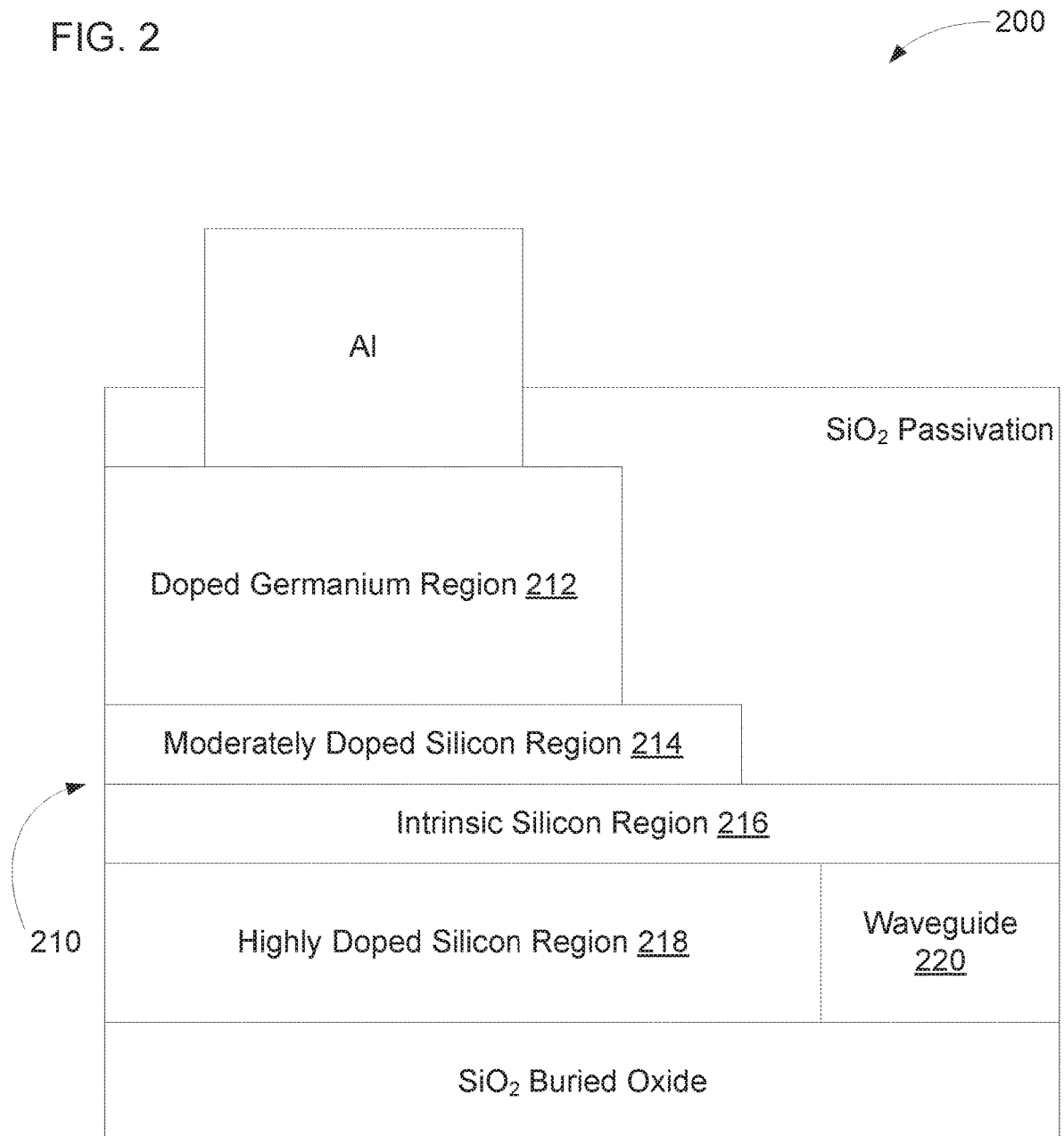
FIG. 2 is a schematic diagram of a cross-section of another example of a system to detect optical energy.

FIG. 2 is a schematic diagram of a cross-section of another example of a system 200 to detect optical energy. The system 200 may include a photodiode 210 (e.g., an avalanche photodiode) coupled to a waveguide 220. The photodiode 210 may include a doped germanium region 212, a moderately doped silicon region 214, an intrinsic silicon region 216, and a highly doped silicon region 218. The waveguide 220 may receive an optical signal, for example from a grating coupler (not shown), and direct the optical signal to the photodiode 210. The waveguide 220 may include intrinsic silicon in an example. The waveguide 220 may be in direct contact with the highly doped silicon region 218 and the intrinsic silicon region 216. The waveguide 220 may have a length between about 4 micrometers (µm) and about 100 µm. The waveguide may have a width between about 500 nanometers (nm) and about 10 µm. In FIG. 2, the waveguide length is measured along the horizontal dimension across the page, and the waveguide width is measured along the dimension into and out of the page (i.e., the dimension perpendicular to the page).

The optical signal may be evanescently coupled to the doped germanium region 212 (i.e., an absorption region) and cause absorption of the optical energy by the doped germanium region 212. The absorbed optical energy may excite electrons to a conduction band (i.e., generate free electrons). In an example, the doped germanium region 212 may have a p-type doping concentration of at least about $5 \times 10^{18}$ atoms/cm$^3$ (e.g., a p-type doping concentration between about $5 \times 10^{18}$ atoms/cm$^3$ and about $5 \times 10^{19}$ atoms/cm$^3$, a p-type doping concentration between about $5 \times 10^{18}$ atoms/cm$^3$ and about $1 \times 10^{19}$ atoms/cm$^3$, or the like). The doped germanium region 212 may have a thickness between about 50 nm and about 2 µm. In FIG. 2, the thicknesses of the regions 212, 214, 216, 218 are measured along the vertical dimension between the top and bottom of the page.

The moderately doped silicon region 214 (i.e., a charge region) may accelerate the free electrons. The electric field may increase with a steep slope between the interface with the doped germanium region 212 and the interface with the intrinsic silicon region 216. The drift velocity of the free electrons may increase until reaching a saturation velocity of the moderately doped silicon region 214. In an example, the moderately doped silicon region 214 may have a p-type doping concentration of at least about $2 \times 10^{17}$ atoms/cm$^3$ (e.g., a p-type doping concentration between about $2 \times 10^{17}$ atoms/cm$^3$ and about $2 \times 10^{18}$ atoms/cm$^3$ or the like). The moderately doped silicon region 214 may have a thickness between about 20 nm and about 100 nm.

The intrinsic silicon region 216 (i.e., a multiplication region) may amplify the number of free electrons. For example, the intrinsic silicon region 216 may generate additional free electrons from impact ionization of the accelerated free electrons. The additional free electrons may generate still more electrons through impact ionization of the additional free electrons. Thus, the intrinsic silicon region 216 may multiply the number of free electrons. The intrinsic silicon region 216 may accelerate some of the free electrons or the additional free electrons to cause the impact ionization. In addition, some impact ionization may occur in the moderately doped silicon region 214. In an example, the intrinsic silicon region 216 may have a p-type doping concentration no greater than about $2 \times 10^{16}$ atoms/cm$^3$ (e.g., a p-type doping concentration between about $1 \times 10^{15}$ atoms/cm$^3$ and about $2 \times 10^{16}$ atoms/cm$^3$ or the like). The intrinsic silicon region 216 may have a thickness between about 50 nm and about 1000 nm.

The highly doped silicon region 218 (i.e., a contacting region) may conduct the free electrons generated by absorption and the free electrons generated by impact ionization. For example, the highly doped silicon region 218 may conduct the electrons to other devices or circuitry, to a metal contact, to an output terminal, or the like. In an example, the highly doped silicon region 218 may have a doping concentration of at least about $1 \times 10^{20}$ atoms/cm$^3$. The highly doped silicon region may have a thickness between about 200 nm and about 2 μm.

Figure 3:
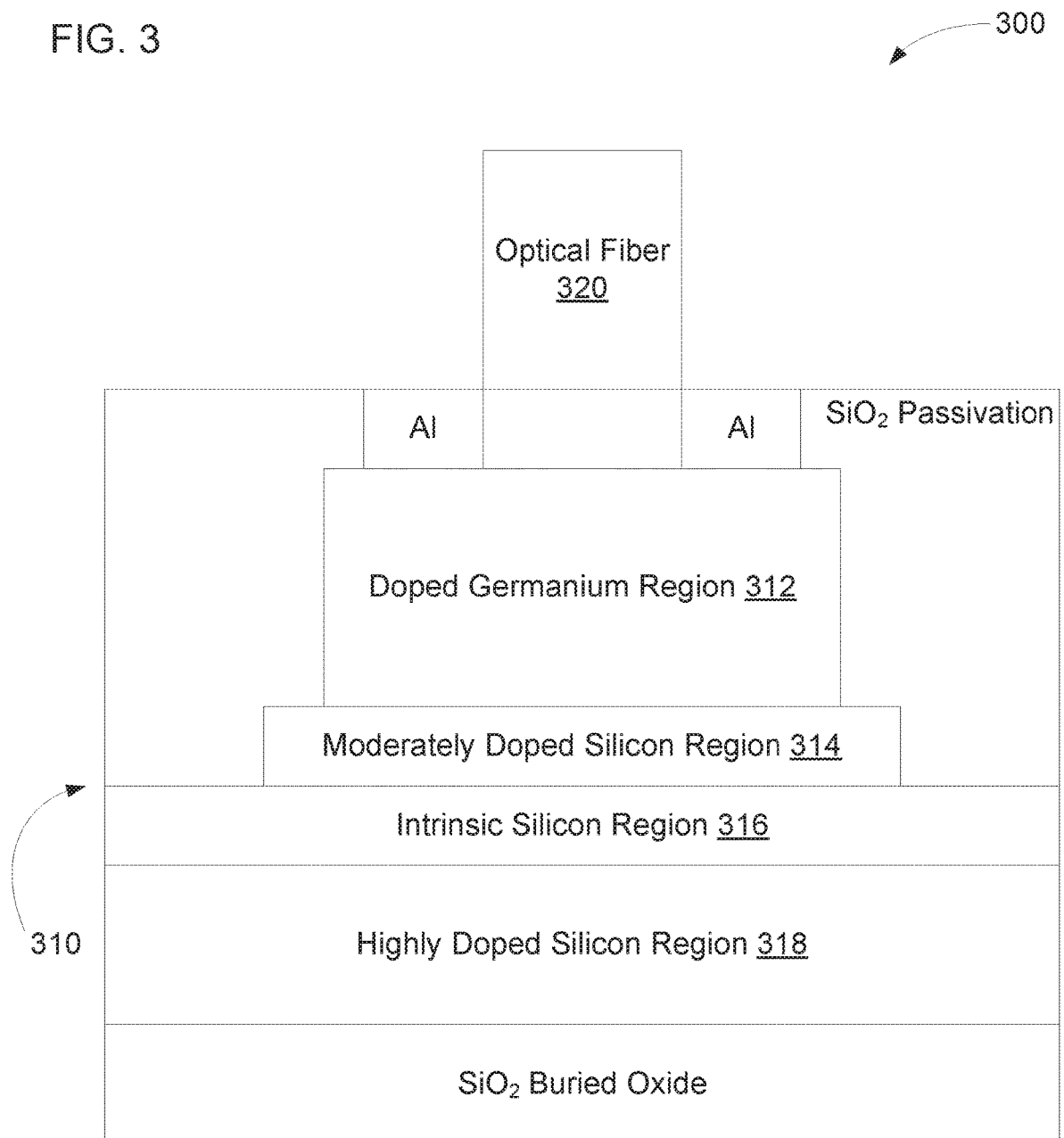
FIG. 3 is a schematic diagram of a cross-section of another example of a system to detect optical energy.

FIG. 3 is a schematic diagram of a cross-section of another example of a system 300 to detect optical energy. The system 300 may include an optical fiber 320 electromagnetically coupled to a photodiode 310. The photodiode 310 may include a doped germanium region 312, a moderately doped silicon region 314, an intrinsic silicon region 316, and a highly doped silicon region 318. The optical fiber 320 may be in direct contact with the doped germanium region 312 or may direct an optical signal towards the doped germanium region 312. For example, there may be silicon dioxide between the optical fiber 320 and the doped germanium region 312. The silicon dioxide may be transparent at the frequencies of the optical signal, so the optical signal may suffer minimal loss before reaching the doped germanium region 312.

The doped germanium region 312 may absorb the optical energy and excite electrons to a conduction band (i.e., generate free electrons) from the absorbed optical energy. The free electrons may travel to the moderately doped silicon region 314. The moderately doped silicon region 314 may accelerate the free electrons towards the intrinsic silicon region 316. The intrinsic silicon region 316 may excite additional electrons to the conduction band (i.e., generate additional free electrons) from impact ionization of the accelerated free electrons. The electrons generated from absorption and the electrons generated by impact ionization may be conducted away by the highly doped silicon region 318.

Figure 4:
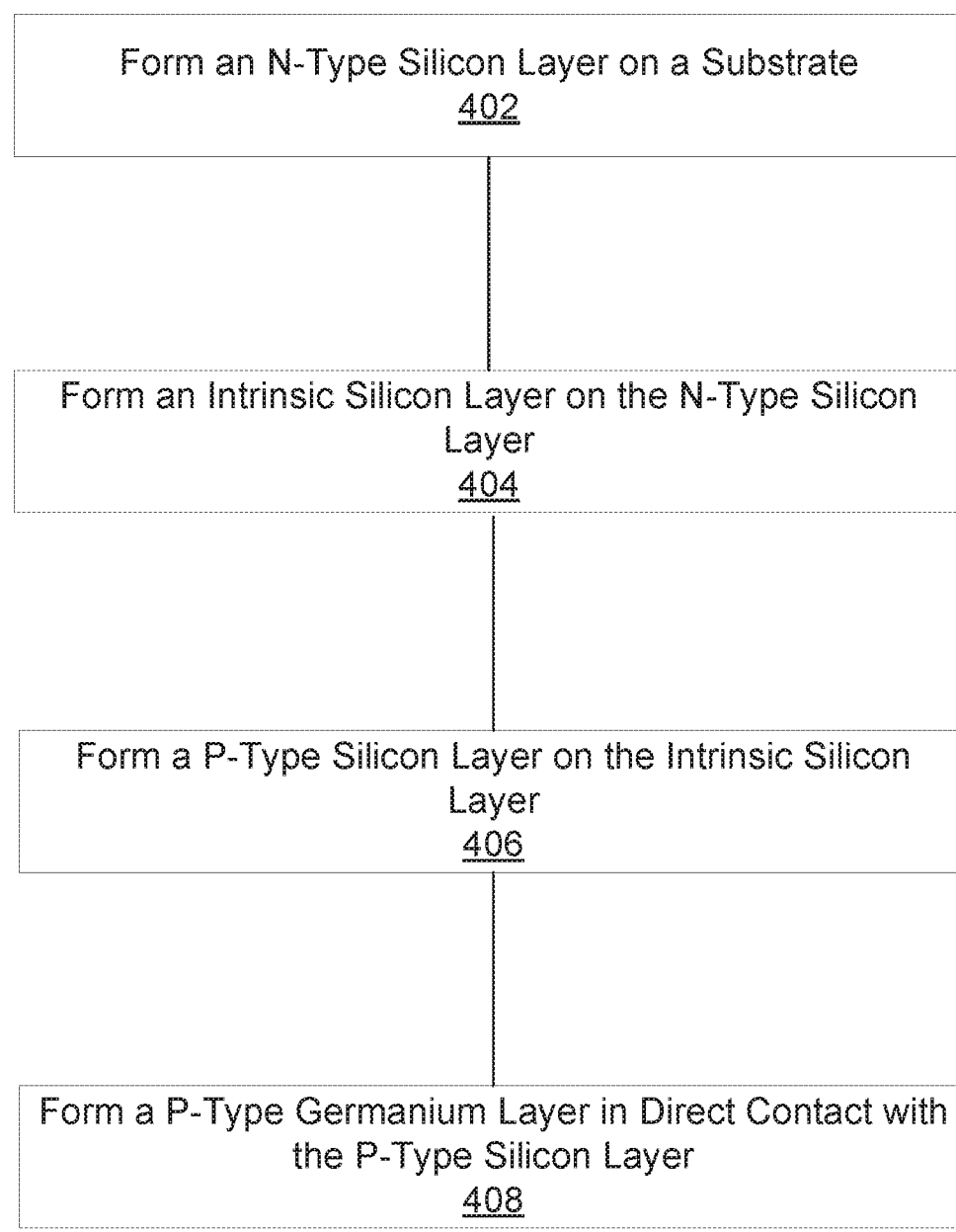
FIG. 4 is a flow diagram of an example of a method to create a photodiode to detect optical energy.

FIG. 4 is a flow diagram of an example of a method 400 to create a photodiode to detect optical energy. Block 402 may include forming an n-type silicon layer on a substrate. The n-type silicon layer may be formed by depositing silicon and implanting an n-type dopant (e.g., phosphorus, arsenic, antimony, or the like) in the silicon, by providing a wafer including a layer of silicon and implanting an n-type dopant in the layer of silicon, or the like. As used herein, the term "layer" refers to a region covering or being covered by another region. For example, the n-type silicon layer may be the highly doped silicon region 218 of FIG. 2.

Block 404 may include forming an intrinsic silicon layer on the n-type silicon layer. For example, the intrinsic silicon layer may be formed by depositing the intrinsic silicon on the n-type silicon layer or counter doping p-type doped silicon to form intrinsic silicon. The intrinsic silicon layer may include a small amount of doping (e.g., a small amount of p-type doping or n-type doping). In one example, the intrinsic silicon layer may be the intrinsic silicon region 216 of FIG. 2. Block 406 may include forming a p-type silicon layer on the intrinsic silicon layer. The p-type silicon layer may be formed by depositing silicon and implanting a p-type dopant (e.g., boron, aluminum, gallium, etc.) in the silicon. In one example, the intrinsic silicon layer and the p-type silicon layer may be formed by a single deposition of silicon followed by implanting of the p-type dopant in a top portion of the deposited silicon. Referring to FIG. 2, the p-type silicon layer may be the moderately doped silicon region 214 in an example.

At block 408, the method 400 may include forming a p-type germanium layer in direct contact with the p-type silicon layer. In some examples, the p-type germanium layer may be moderately or highly doped. The p-type germanium layer may be formed by depositing germanium and implanting a p-type dopant in the germanium. For example, the p-type germanium layer may be the doped germanium region 212 of FIG. 2.

Figure 5:
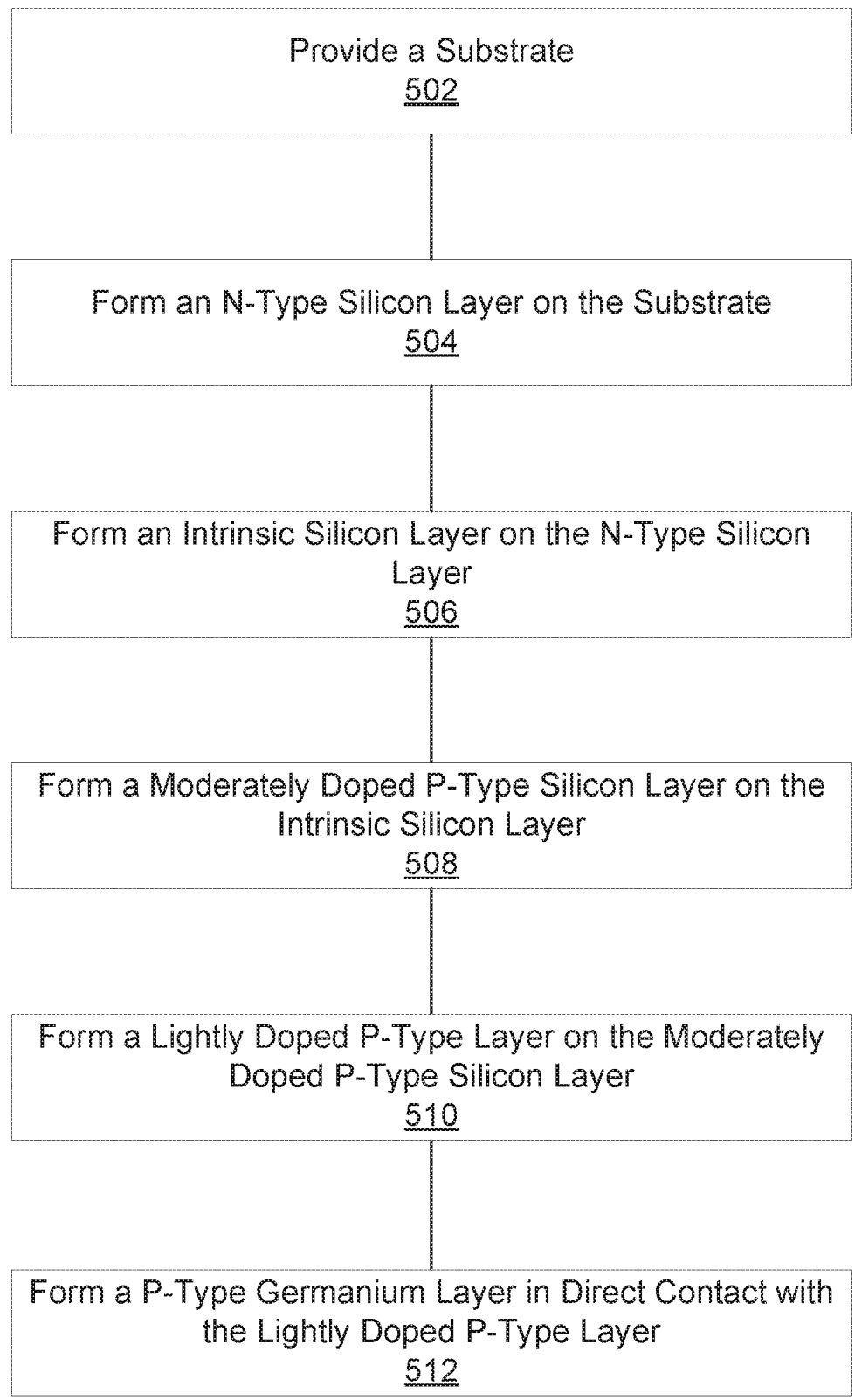
FIG. 5 is a flow diagram of another example of a method to create a photodiode to detect optical energy.

FIG. 5 is a flow diagram of another example of a method 500 to create a photodiode to detect optical energy. At block 502, the method 500 may include providing a substrate. For example, the substrate may be a silicon on insulator wafer, a silicon dioxide wafer, a region of silicon dioxide formed on a silicon wafer (e.g., grown on the silicon wafer), or the like. In one example, the substrate may be the silicon dioxide buried oxide shown in FIG. 8. Block 504 may include forming an n-type silicon layer on the substrate. The n-type silicon layer may be highly doped (e.g., with a doping concentration of at least about $1 \times 10^{20}$ atoms/cm$^3$) and have a thickness between about 200 nm and about 2 μm. For example, the n-type silicon layer may be the doped contact region 818 of FIG. 8.

Figure 8:
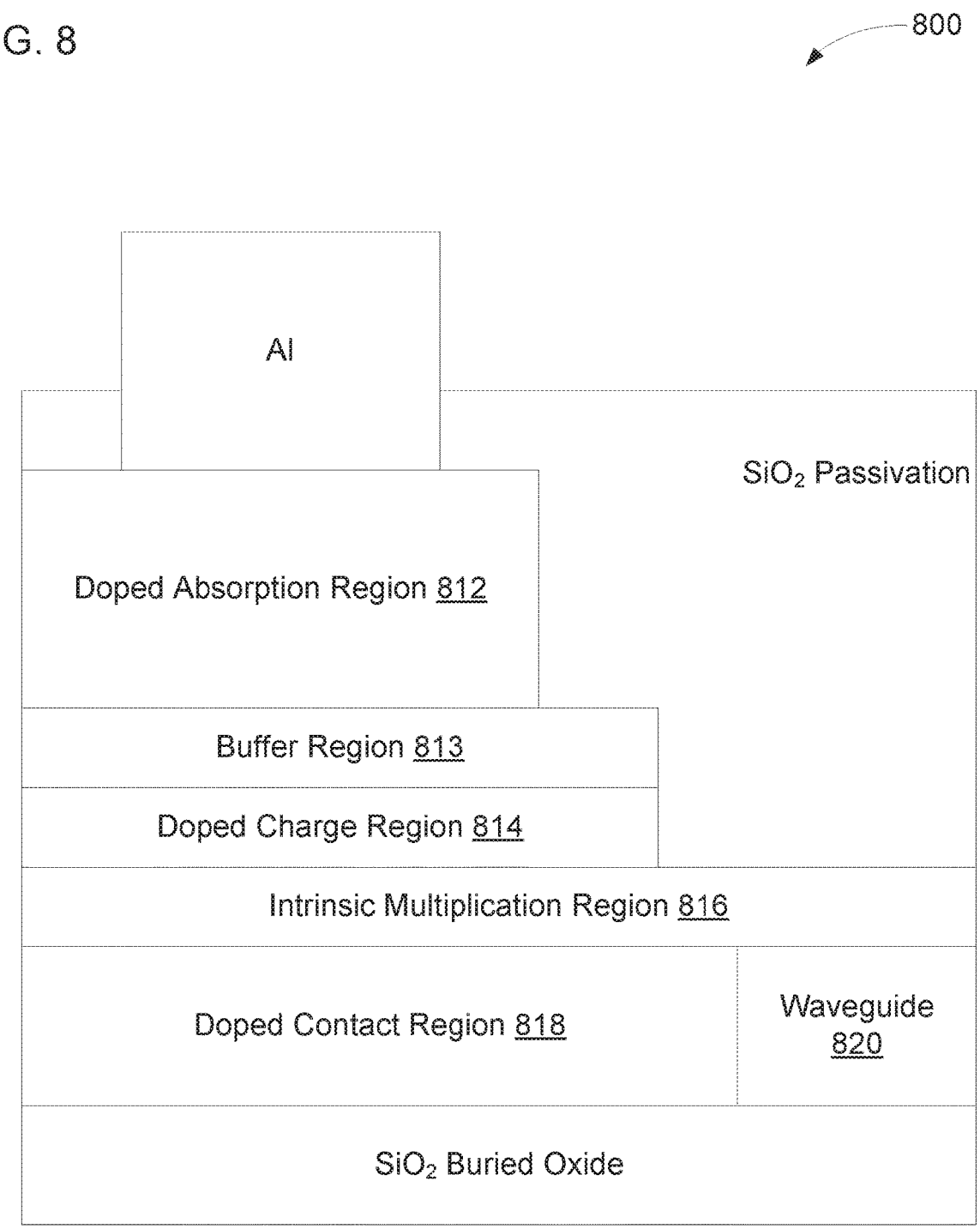
FIG. 8 is a schematic diagram of a cross-section of another example of a device to detect optical energy.

Block 506 may include forming an intrinsic silicon layer on the n-type silicon layer. The intrinsic silicon layer may have a p-type doping concentration no greater than about $2 \times 10^{16}$ atoms/cm$^3$ and a thickness between about 50 nm and about 1000 nm. Referring to FIG. 8, the intrinsic silicon layer may be, for example, the intrinsic multiplication region 816. Block 508 may include forming a moderately doped p-type silicon layer on the intrinsic silicon layer. The moderately doped p-type silicon layer may be formed by depositing silicon and implanting p-type dopants in the deposited silicon, by implanting p-type dopants in the top portion of intrinsic silicon layer, or the like. The moderately doped p-type silicon layer may have a p-type doping concentration between about $2 \times 10^{17}$ atoms/cm$^3$ and about $2 \times 10^{18}$ atoms/cm$^3$ and a thickness between about 20 nm and about 100 nm. In one example, the moderately doped p-type silicon layer may be the doped charge region 814 of FIG. 8.

At block 510, the method 500 may include forming a lightly doped p-type layer on the moderately doped p-type silicon layer. As used herein, the term "lightly doped" refers to a semiconductor with a concentration of doped atoms no greater than about $2 \times 10^{17}$ atoms/cm$^3$. The lightly doped p-type layer may include at least one of silicon and germanium. For example, the lightly doped p-type layer may include silicon and no germanium, germanium and no silicon, or both silicon and germanium. The lightly doped p-type layer may be formed by depositing silicon or germanium on the moderately doped p-type silicon layer. The lightly doped p-type layer may be intrinsic or may include a small amount of doping. The lightly doped p-type layer may have a p-type doping concentration no greater than about $5 \times 10^{17}$ atoms/cm$^3$ (e.g., a p-type doping concentration between about $1 \times 10^{15}$ atoms/cm$^3$ and about $5 \times 10^{17}$ atoms/ cm³ or the like). The lightly doped p-type layer may have a thickness between about 20 nm and about 50 nm. For example, the lightly doped p-type layer may be the buffer region 813 of FIG. 8.

Block 512 may include forming a p-type germanium layer in direct contact with the lightly doped p-type layer. The p-type germanium layer may have a sloped electric field that prevents a strong electric field from causing impact ionization throughout the p-type doped germanium layer. The lightly doped p-type layer may impede a strong electric field from extending into the p-type germanium layer to further prevent impact ionization from occurring in the p-type doped germanium layer. The p-type germanium layer may have a p-type doping concentration of at least about $5\times10^{18}$ atoms/cm³ and a thickness between about 50 nm and about 2 μm. In one example, the p-type germanium layer may be the doped absorption region 812 of FIG. 8.

Figure 6:
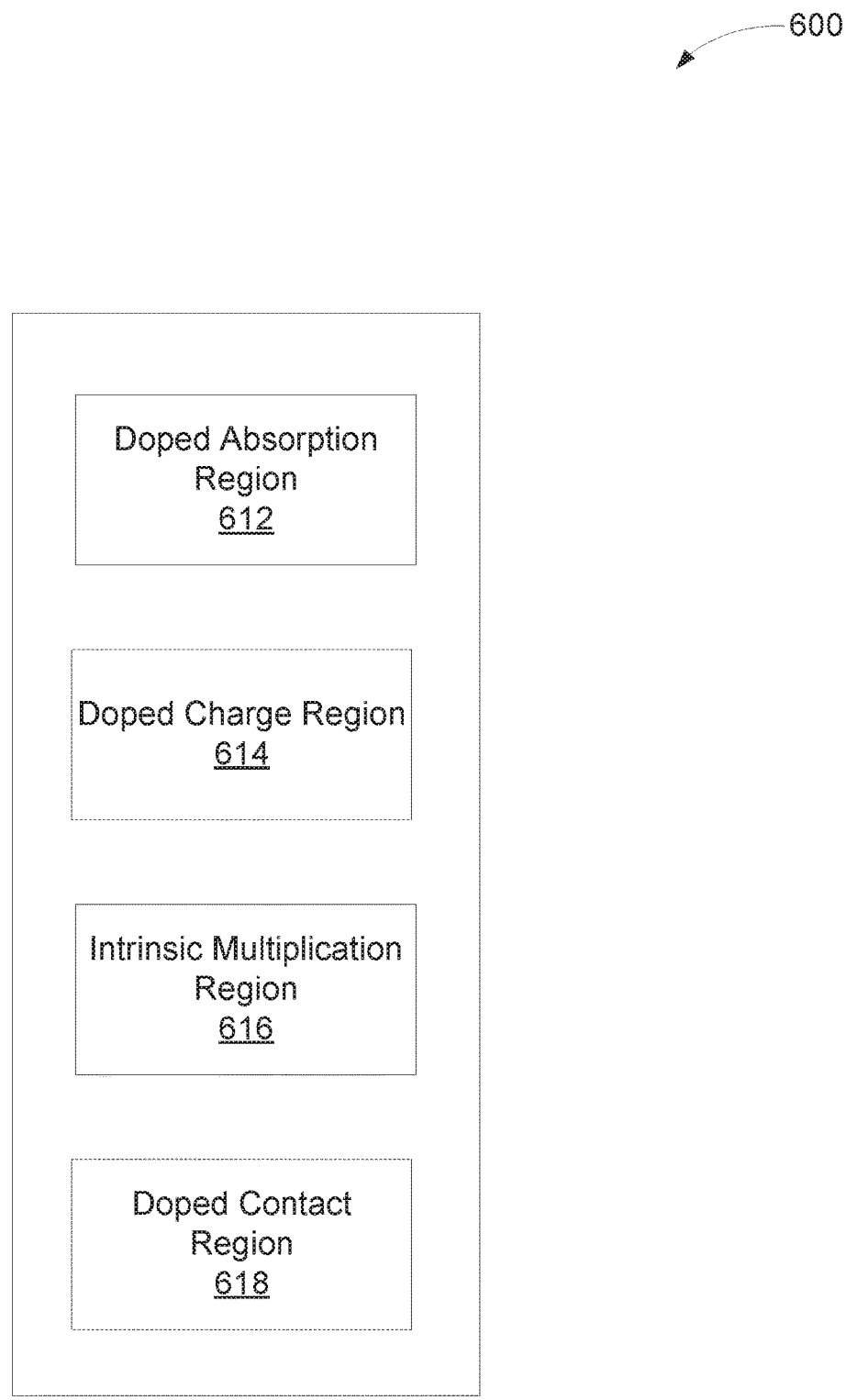
FIG. 6 is a block diagram of an example of a device to detect optical energy.

FIG. 6 is a block diagram of an example of a device 600 to detect optical energy. The device 600 may include a doped absorption region 612 to receive optical energy and generate free electrons from the received optical energy. For example, the optical energy may be absorbed to excite electrons to a conduction band. The doped absorption region 612 may be at least moderately doped. The doped absorption region 612 may include germanium; a compound semiconductor that includes combination of indium, gallium, or arsenic; a group 13 element; a group 15 element; or the like. The doped absorption region 612 may include p-type or n-type doping.

A doped charge region 614 may increase an electric field as the distance from the doped absorption region increases. The increasing electric field in the doped charge region 614 may increase a drift velocity of the free electrons until they reach a saturation velocity. The doped charge region 614 may also prevent a strong electric field from extending into the doped absorption region 612. The doped charge region 614 may be at least moderately doped. The doped charge region 614 may include silicon; a combination of indium, gallium, arsenic, aluminum, or phosphorous; a group 13 element; a group 15 element; or the like. The doped charge region 614 may include p-type or n-type doping. The doped charge region 614 may have the same doping as the doped absorption region 612.

The device 600 may also include an intrinsic multiplication region 616 to generate additional free electrons from impact ionization of the generated free electrons. The intrinsic multiplication region may include a strong electric field that accelerates the free electrons generated from the impact ionization to cause additional impact ionization and free still more electrons. The intrinsic multiplication region 616 may include silicon; a combination of indium, gallium, arsenic, or phosphorous; a group 13 element; a group 15 element; or the like.

The device 600 may include a doped contact region 618 to conduct away the free electrons generated from absorption and the additional free electrons generated from impact ionization. The doped contact region 618 may also provide electrons for depleting the doped absorption region 612, the doped charge region 614, and the intrinsic multiplication region 616. The doped contact region 618 may be at least moderately doped. The doped contact region 618 may include silicon; a combination of indium, gallium, arsenic, or phosphorous; a group 13 element; a group 15 element; or the like. The doped contact region 618 may include n-type or p-type doping. In some examples, the doped contact region 618 may have the opposite doping of the doped absorption region 612 or the doped charge region 614. In various examples, the device 600 may include a waveguide and be built on a silicon on insulator substrate, may be a normal incidence device built on a bulk silicon substrate, may be a backside illuminated device built on a bulk silicon substrate, or the like.

Figure 7:
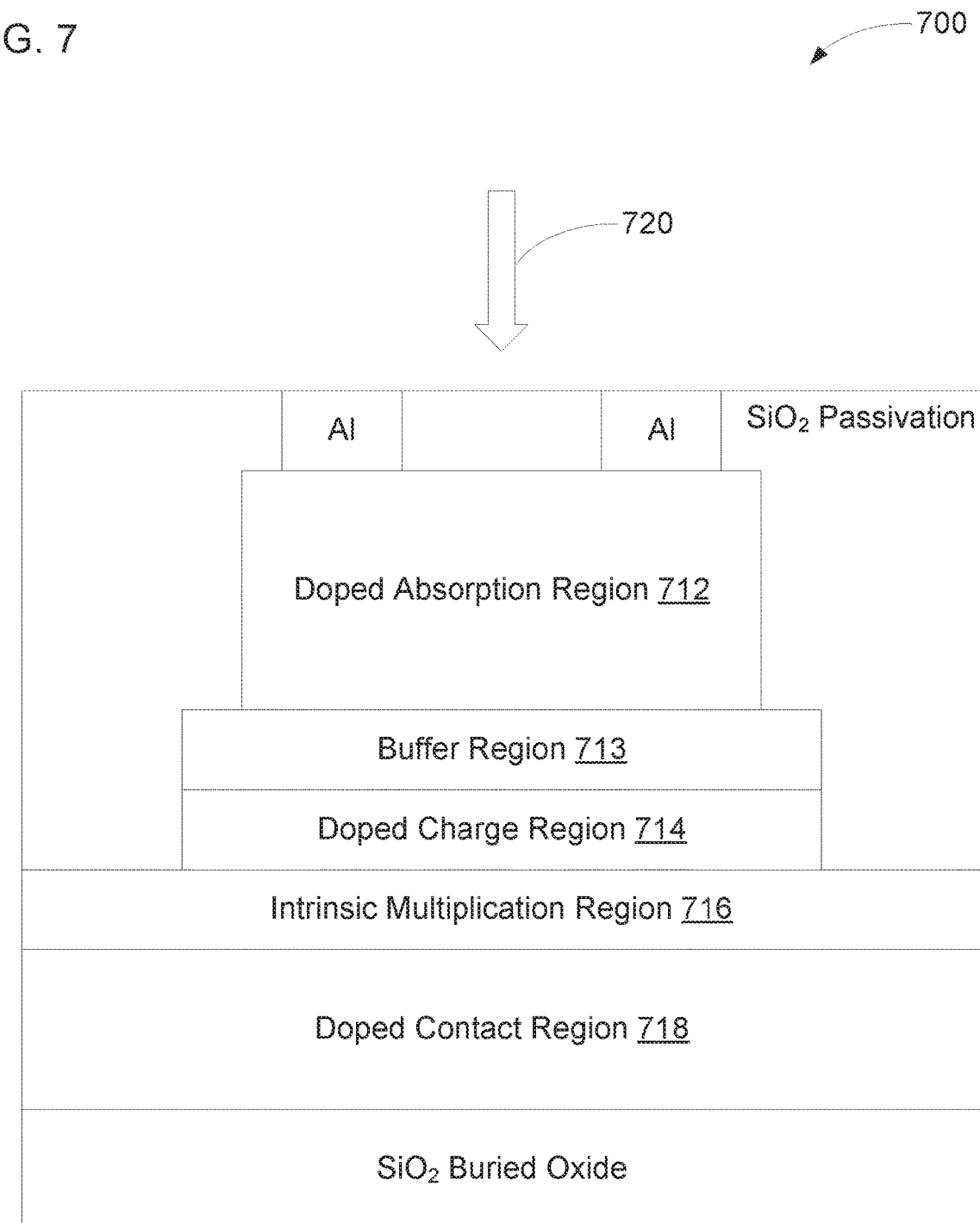
FIG. 7 is a schematic diagram of a cross-section of another example of a device to detect optical energy.

FIG. 7 is a schematic diagram of a cross-section of another example of a device 700 to detect optical energy. The device 700 may include a doped absorption region 712. The doped absorption region 712 may absorb optical energy 720 incident on the doped absorption region 712 and generate free electrons from the absorbed optical energy. The optical energy 720 may pass through silicon dioxide or another material transparent to the optical energy 720 before impinging on the doped absorption region 712. The doped absorption region 712 may be formed as a ring having a diameter between about 10 μm and about 100 μm and a thickness between about 50 nm and about 2 μm. In FIG. 7, the thicknesses of the regions 712, 713, 714, 716, 718 are measured along the vertical dimension between the top and bottom of the page, and the diameter may be measured in a direction perpendicular to the vertical dimension. The doped absorption region 712 may be at least moderately doped. In one example, the doped absorption region 712 may include germanium and may have a p-type doping concentration between about $5\times10^{18}$ atoms/cm³ and about $5\times10^{19}$ atoms/cm³.

The device 700 may include a buffer region 713 in direct contact with the doped absorption region 712 and in direct contact with a doped charge region 714. The buffer region 713 may impede a strong electric field from extending into the doped absorption region 712. For example, an electric field in the doped charge region 714 may decrease as the distance to the buffer region 713 decreases (e.g., an electric field resulting when a reverse bias is applied to the device 700). The electric field may further decrease in the buffer region 713 as the distance to the doped absorption region 712 decreases. Accordingly, the additional decrease in the electric field caused by the buffer region 713 may further impede a strong electric field from occurring in the doped absorption region 712. In an example, the buffer region may include silicon and may be no more than lightly doped (e.g., lightly doped silicon, intrinsic silicon, or the like). For example, the buffer region may have a p-type doping concentration no greater than about $5\times10^{17}$ atoms/cm³ (e.g., a p-type doping concentration between about $1\times10^{15}$ atoms/cm³ and about $5\times10^{17}$ atoms/cm³ or the like). The buffer region may have a thickness between about 20 nm and about 50 nm. In alternate examples, the buffer region may be moderately or highly doped with a p-type dopant.

The doped charge region 714 may increase an electric field as the distance from the doped absorption region 712 increases. The doped charge region 714 may be at least moderately doped. In one example, the doped charge region 714 may include silicon and may have a p-type doping concentration between about $2\times10^{17}$ atoms/cm³ and about $2\times10^{18}$ atoms/cm³. The doped charge region 714 may have a thickness between about 20 nm and about 100 nm.

The device 700 may include an intrinsic multiplication region 716. The intrinsic multiplication region 716 may generate additional free electrons from impact ionization of the free electrons generated by absorption. In an example, the intrinsic multiplication region 716 may include silicon and may have a p-type doping concentration between about $1\times10^{15}$ atoms/cm³ and about $2\times10^{16}$ atoms/cm³. The intrinsic multiplication region 716 may have a thickness between about 50 nm and about 1000 nm. The device 700 may also include a doped contact region 718. The doped contact region 718 may conduct away the free electrons and the additional free electrons. In one example, the doped contact region 718 may include silicon and may have an n-type doping concentration of about 1×10²⁰ atoms/cm³. The doped contact region 718 may have a thickness between about 200 nm and about 2 µm.

FIG. 8 is a schematic diagram of a cross-section of another example of a device 800 to detect optical energy. The device 800 may include a doped absorption region 812. The doped absorption region 812 may receive optical energy and generate free electrons from the received optical energy through absorption. The free electrons may travel to a buffer region 813 that impedes a strong electric field from extending into the doped absorption region 812. The electrons may travel through the buffer region 813 to a doped charge region 814. The doped charge region 814 may increase an electric field as the distance to an intrinsic multiplication region 816 decreases. Some generation of additional electrons through impact ionization may also occur in the doped charge region 814.

The intrinsic multiplication region 816 may generate additional electrons through impact ionization of the accelerated electrons. The intrinsic multiplication region 816 may also increase the drift velocity of the electrons generated from impact ionization and the electrons generated from absorption to cause impact ionization of still more electrons. Thus, the intrinsic multiplication region 816 may multiply the number of free electrons. The free electrons generated from absorption and the free electrons generated from impact ionization may travel through the intrinsic multiplication region 816 to a doped contact region 818. The doped contact region 818 may conduct away the free electrons.

In the illustrated example, the device 800 may include a waveguide 820. In other examples, the device 800 may be electromagnetically coupled and/or physically coupled to but not include the waveguide 820. The waveguide 820 may receive optical energy from a grating coupler (not shown) coupled to an optical fiber (not shown) and direct the optical energy to the device 800. The waveguide 820 may be in direct contact with the doped contact region 818 and/or the intrinsic multiplication region 816. The waveguide 820 may include silicon. For example, the waveguide 820 may include intrinsic silicon. In an example, the waveguide 820 may have a length between about 4 µm and about 100 µm and a width between about 500 nm and about 10 µm. In FIG. 8, the waveguide length is measured along the horizontal dimension across the page, and the waveguide width is measured along the dimension into and out of the page (i.e., the dimension perpendicular to the page). The waveguide 820 may transfer the optical energy to the doped absorption region 812 evanescently.

The above description is illustrative of various principles and implementations of the present disclosure. Numerous variations and modifications will become apparent to those skilled in the art once the above disclosure is fully appreciated. Accordingly, the scope of the present application should be determined only by the following claims.

What is claimed is:

1. A system, comprising:
   a waveguide; and
   a photodiode electromagnetically coupled to the waveguide, the photodiode including:
     a doped germanium region,
     a moderately doped silicon region in direct contact with the doped germanium region,
     an intrinsic silicon region in direct contact with the moderately doped silicon region, and
     a highly doped silicon region in direct contact with the intrinsic silicon region, the waveguide in direct contact with the highly doped silicon region and with the intrinsic silicon region, both the waveguide and highly doped silicon region disposed below the intrinsic silicon region.

2. The system of claim 1, wherein the doped germanium region includes a p-type doping concentration of at least about 5×10¹⁸ atoms/cm³.

3. The system of claim 1, wherein the intrinsic silicon region includes a p-type doping concentration less than or equal to about 2×10¹⁶ atoms/cm³.

4. The system of claim 1, wherein the intrinsic silicon region has a thickness between about 50 nanometers and about 1000 nanometers.

5. A method, comprising:
   forming an n-type silicon layer on a substrate;
   forming a waveguide on the substrate in direct contact with the n-type silicon layer;
   forming an intrinsic silicon layer on the n-type silicon layer and in direct contact with the waveguide, both the waveguide and n-type silicon layer disposed below the intrinsic silicon layer;
   forming a p-type silicon layer on the intrinsic silicon layer and; and
   forming a p-type germanium layer in direct contact with the p-type silicon layer.

6. The method of claim 5, wherein forming the p-type silicon layer comprises:
   forming a moderately doped p-type silicon layer on the intrinsic silicon layer; and
   forming a lightly doped p-type layer on the moderately doped p-type silicon layer, wherein the lightly doped p-type layer comprises at least one of silicon and germanium, and wherein the p-type germanium layer is in direct contact with the lightly doped p-type layer.

7. The method of claim 6, wherein the moderately doped p-type silicon layer has a doping concentration between about 2×10¹⁷ atoms/cm³ and about 2×10¹⁸ atoms/cm³, and wherein the lightly doped p-type layer has a doping concentration between about 1×10¹⁵ atoms/cm³ and about 5×10¹⁷ atoms/cm³.

8. The method of claim 6, wherein forming the lightly doped p-type layer forming a lightly doped p-type layer with a thickness between about 20 nanometers and about 50 nanometers, and wherein forming the moderately doped p-type silicon layer comprises forming a moderately doped p-type silicon layer with a thickness between about 20 nanometers and about 100 nanometers.

9. The method of claim 5, wherein forming the p-type germanium layer comprises forming a p-type germanium layer with a thickness between about 50 nanometers and about 2,000 nanometers.

10. The system of claim 1, wherein the highly doped silicon region comprises an n-type silicon layer formed on a silicon dioxide buried oxide layer.

11. The system of claim 10, wherein the highly doped silicon region includes an n-type doping concentration of at least about 1×10²⁰ atoms/cm³.

12. The system of claim 10, wherein the highly doped silicon region comprises a thickness between about 200 nm and about 2 µm.

13. The system of claim 11, wherein the moderately doped silicon region comprises a moderately doped p-type silicon layer.

14. The system of claim 13, wherein the moderately doped silicon region includes a p-type doping concentration between about $2\times10^{17}$ atoms/cm$^3$ and about $2\times10^{18}$ atoms/cm$^3$.

15. The system of claim 14, wherein the moderately doped silicon region comprises a thickness between about 20 nm and about 100 nm.

* * * * *